US010231139B2

(12) United States Patent
Dudzinski et al.

(10) Patent No.: US 10,231,139 B2
(45) Date of Patent: Mar. 12, 2019

(54) NODE ROLE ASSIGNMENT IN NETWORKS

(71) Applicant: Airspan Networks Inc., Boca Raton, FL (US)

(72) Inventors: Krzysztof Dudzinski, Slough (GB); Honey Kanwar Singh Sarao, Slough (GB); Jonathan Anthony Eva, Saunderton (GB)

(73) Assignee: AIRSPAN NETWORKS INC., Boca Raton, FL (US)

( * ) Notice: Subject to any disclaimer, the term of this patent is extended or adjusted under 35 U.S.C. 154(b) by 117 days.

(21) Appl. No.: 15/187,574

(22) Filed: Jun. 20, 2016

(65) Prior Publication Data

US 2016/0381574 A1 Dec. 29, 2016

(30) Foreign Application Priority Data

Jun. 25, 2015 (GB) .................................. 1511200.6
Oct. 21, 2015 (GB) .................................. 1518654.7

(51) Int. Cl.
*H04W 24/02* (2009.01)
*H04L 29/08* (2006.01)
(Continued)

(52) U.S. Cl.
CPC ............ *H04W 24/02* (2013.01); *F16M 11/06* (2013.01); *G01S 3/043* (2013.01); *G01S 3/14* (2013.01);
(Continued)

(58) Field of Classification Search
CPC .. H04W 24/02; H04W 4/001; H04L 41/0806; H04L 67/34
(Continued)

(56) References Cited

U.S. PATENT DOCUMENTS 497,147 A 5/1893 Urich
3,789,415 A 1/1974 Vickland
(Continued)

FOREIGN PATENT DOCUMENTS

CN 1284794 A 2/2001
CN 104635203 A 5/2015
(Continued)

OTHER PUBLICATIONS

UK Search Report from GB 1519237.0, dated Jun. 10 Apr. 2016, 3 pgs.
(Continued)

*Primary Examiner* — Faisal Choudhury
(74) *Attorney, Agent, or Firm* — Haynes Beffel & Wolfeld LLP

(57) ABSTRACT

There is provided a node for use in a network, the node comprising: communication circuitry to communicate with a management server. Bootstrap circuitry initially identifies an intermediate node from at least one available node in the network in response to the communication circuitry being unable to communicate with the management server directly. The communication circuitry is arranged to communicate with the management server indirectly via the intermediate node when unable to communicate with the management server directly. Role assignment circuitry assigns a role to be performed by the node in the network based on whether the communication circuitry communicates with the management server directly, or indirectly via an intermediate node.

19 Claims, 8 Drawing Sheets

(51) Int. Cl.

| | |
|---|---|
| G01S 19/53 | (2010.01) |
| G01S 3/14 | (2006.01) |
| G01S 5/02 | (2010.01) |
| H01Q 1/02 | (2006.01) |
| H01Q 3/04 | (2006.01) |
| H01Q 3/24 | (2006.01) |
| H01Q 3/26 | (2006.01) |
| H01Q 21/06 | (2006.01) |
| H01Q 21/08 | (2006.01) |
| H01Q 21/20 | (2006.01) |
| H01Q 21/28 | (2006.01) |
| H01Q 25/00 | (2006.01) |
| H04B 7/06 | (2006.01) |
| H04B 7/08 | (2006.01) |
| H04W 28/02 | (2009.01) |
| H04W 88/04 | (2009.01) |
| H05K 7/20 | (2006.01) |
| H04L 12/24 | (2006.01) |
| H04W 16/28 | (2009.01) |
| H04W 40/22 | (2009.01) |
| H04W 72/08 | (2009.01) |
| H04W 24/10 | (2009.01) |
| H01Q 1/24 | (2006.01) |
| H01Q 1/50 | (2006.01) |
| H01Q 3/10 | (2006.01) |
| H04W 72/04 | (2009.01) |
| G01S 3/04 | (2006.01) |
| G01S 19/24 | (2010.01) |
| H01Q 1/36 | (2006.01) |
| H01Q 1/42 | (2006.01) |
| H01Q 3/12 | (2006.01) |
| H01Q 21/00 | (2006.01) |
| H01Q 1/12 | (2006.01) |
| H01Q 3/02 | (2006.01) |
| H01Q 3/36 | (2006.01) |
| H01Q 21/24 | (2006.01) |
| H04B 7/0456 | (2017.01) |
| F16M 11/06 | (2006.01) |
| H04L 12/26 | (2006.01) |
| H04W 24/08 | (2009.01) |
| H04W 28/24 | (2009.01) |
| H04W 48/06 | (2009.01) |
| H04W 4/50 | (2018.01) |
| H04L 12/28 | (2006.01) |
| H04W 84/04 | (2009.01) |
| H04W 84/02 | (2009.01) |
| H04W 88/08 | (2009.01) |

(52) U.S. Cl.
CPC .......... *G01S 5/0247* (2013.01); *G01S 19/24* (2013.01); *G01S 19/53* (2013.01); *H01Q 1/02* (2013.01); *H01Q 1/1207* (2013.01); *H01Q 1/1228* (2013.01); *H01Q 1/246* (2013.01); *H01Q 1/36* (2013.01); *H01Q 1/42* (2013.01); *H01Q 1/50* (2013.01); *H01Q 3/02* (2013.01); *H01Q 3/04* (2013.01); *H01Q 3/10* (2013.01); *H01Q 3/12* (2013.01); *H01Q 3/24* (2013.01); *H01Q 3/26* (2013.01); *H01Q 3/2611* (2013.01); *H01Q 3/36* (2013.01); *H01Q 21/00* (2013.01); *H01Q 21/065* (2013.01); *H01Q 21/08* (2013.01); *H01Q 21/205* (2013.01); *H01Q 21/24* (2013.01); *H01Q 21/28* (2013.01); *H01Q 25/002* (2013.01); *H01Q 25/005* (2013.01); *H04B 7/0456* (2013.01); *H04B 7/0617* (2013.01); *H04B 7/0621* (2013.01); *H04B 7/0691* (2013.01); *H04B 7/0695* (2013.01); *H04B 7/086* (2013.01); *H04B 7/088* (2013.01); *H04B 7/0874* (2013.01); *H04L 41/0806* (2013.01); *H04L 41/0816* (2013.01); *H04L 43/0829* (2013.01); *H04L 67/18* (2013.01); *H04L 67/34* (2013.01); *H04W 4/50* (2018.02); *H04W 16/28* (2013.01); *H04W 24/08* (2013.01); *H04W 24/10* (2013.01); *H04W 28/0236* (2013.01); *H04W 28/0268* (2013.01); *H04W 28/0284* (2013.01); *H04W 28/24* (2013.01); *H04W 40/22* (2013.01); *H04W 48/06* (2013.01); *H04W 72/042* (2013.01); *H04W 72/085* (2013.01); *H04W 88/04* (2013.01); *H05K 7/20* (2013.01); *H01Q 1/1257* (2013.01); *H04B 7/0817* (2013.01); *H04W 84/02* (2013.01); *H04W 84/045* (2013.01); *H04W 88/08* (2013.01)

(58) Field of Classification Search
USPC .......................................................... 370/254
See application file for complete search history.

(56) References Cited

U.S. PATENT DOCUMENTS

| | | |
|---|---|---|
| 3,844,341 A | 10/1974 | Bimshas, Jr. et al. |
| 4,436,190 A | 3/1984 | Wentzell |
| 4,599,620 A | 7/1986 | Evans |
| 4,633,256 A | 12/1986 | Chadwick |
| 4,959,653 A | 9/1990 | Ganz |
| 5,049,891 A | 9/1991 | Ettinger et al. |
| 5,125,008 A | 6/1992 | Trawick et al. |
| 5,357,259 A | 10/1994 | Nosal |
| 6,124,832 A | 9/2000 | Jeon et al. |
| 6,404,385 B1 | 6/2002 | Croq et al. |
| 6,486,832 B1 | 11/2002 | Abramov et al. |
| 6,522,898 B1 | 2/2003 | Kohno et al. |
| 6,621,454 B1 | 9/2003 | Reudink et al. |
| 6,934,511 B1 | 8/2005 | Lovinggood et al. |
| 6,963,747 B1 | 11/2005 | Elliott |
| 7,062,294 B1 | 6/2006 | Rogard et al. |
| 7,403,748 B1 | 7/2008 | Keskitalo et al. |
| 7,515,916 B1 | 4/2009 | Alexander |
| 7,593,693 B1 | 9/2009 | Kasapi et al. |
| 7,664,534 B1 | 2/2010 | Johnson |
| 7,697,626 B2 | 4/2010 | Wang et al. |
| 8,340,580 B1 | 12/2012 | Epstein |
| 8,509,724 B2 | 8/2013 | D'Amico et al. |
| 8,577,416 B2 | 11/2013 | Nandagopalan et al. |
| 8,630,267 B1 | 1/2014 | Jin |
| 9,173,064 B1 | 10/2015 | Spain, Jr. |
| 9,179,360 B1 | 11/2015 | Vivanco |
| 9,692,124 B2 | 6/2017 | Caimi et al. |
| 9,698,891 B2 | 7/2017 | Larsson |
| 9,706,419 B2 | 7/2017 | Bozier et al. |
| 2002/0042274 A1 | 4/2002 | Ades |
| 2002/0142779 A1 | 10/2002 | Goto et al. |
| 2003/0195017 A1 | 10/2003 | Chen et al. |
| 2003/0228857 A1 | 12/2003 | Maeki |
| 2004/0077354 A1 | 4/2004 | Jason et al. |
| 2004/0106436 A1 | 6/2004 | Ochi et al. |
| 2004/0233103 A1 | 11/2004 | Toshev |
| 2004/0242274 A1 | 12/2004 | Corbett et al. |
| 2005/0048921 A1 | 3/2005 | Chung |
| 2005/0063340 A1 | 3/2005 | Hoffmann et al. |
| 2005/0157684 A1 | 7/2005 | Ylitalo et al. |
| 2005/0192037 A1 | 9/2005 | Nanda et al. |
| 2005/0285784 A1 | 12/2005 | Chiang et al. |
| 2006/0072518 A1 | 4/2006 | Pan et al. |
| 2006/0292991 A1 | 12/2006 | Abramov et al. |
| 2008/0005121 A1 | 1/2008 | Lam et al. |
| 2008/0123589 A1 | 5/2008 | Lee et al. |
| 2008/0287068 A1 | 11/2008 | Etemad |

(56) References Cited

U.S. PATENT DOCUMENTS

| | | |
|---|---|---|
| 2009/0005121 A1 | 1/2009 | Wong et al. |
| 2009/0032223 A1 | 2/2009 | Zimmerman et al. |
| 2009/0046638 A1 | 2/2009 | Rappaport et al. |
| 2009/0067333 A1 | 3/2009 | Ergen et al. |
| 2009/0086864 A1 | 4/2009 | Komninakis et al. |
| 2009/0103492 A1 | 4/2009 | Altshuller et al. |
| 2009/0116444 A1 | 5/2009 | Wang et al. |
| 2009/0207077 A1 | 8/2009 | Hwang et al. |
| 2009/0252088 A1 | 10/2009 | Rao et al. |
| 2009/0274076 A1 | 11/2009 | Muharemovic et al. |
| 2009/0310554 A1 | 12/2009 | Sun et al. |
| 2010/0071049 A1 | 3/2010 | Bahr et al. |
| 2010/0130150 A1 | 5/2010 | D'Amico et al. |
| 2010/0216477 A1 | 8/2010 | Ryan |
| 2010/0240380 A1 | 9/2010 | Yim et al. |
| 2011/0003554 A1* | 1/2011 | Sekiya ............... H04L 41/5009 455/67.11 |
| 2011/0163905 A1 | 7/2011 | Denis et al. |
| 2011/0235569 A1 | 9/2011 | Huang et al. |
| 2011/0244808 A1 | 10/2011 | Shiotsuki et al. |
| 2011/0312269 A1 | 12/2011 | Judd et al. |
| 2012/0002598 A1 | 1/2012 | Seo et al. |
| 2012/0015659 A1 | 1/2012 | Kalyani et al. |
| 2012/0046026 A1 | 2/2012 | Chande et al. |
| 2012/0119951 A1 | 5/2012 | Vollath |
| 2012/0252453 A1 | 10/2012 | Nagaraja et al. |
| 2012/0329511 A1* | 12/2012 | Keisu ............... H04L 41/0806 455/524 |
| 2013/0203401 A1 | 8/2013 | Ryan et al. |
| 2013/0215844 A1 | 8/2013 | Seol et al. |
| 2014/0256376 A1 | 9/2014 | Weissman et al. |
| 2014/0313080 A1 | 10/2014 | Smith et al. |
| 2015/0078191 A1 | 3/2015 | Jongren et al. |
| 2016/0037550 A1 | 2/2016 | Barabell et al. |
| 2016/0255667 A1* | 9/2016 | Schwartz ............ H04W 76/022 455/445 |
| 2016/0262045 A1 | 9/2016 | Yang et al. |
| 2016/0277087 A1 | 9/2016 | Jo et al. |
| 2016/0377695 A1 | 12/2016 | Lysejko et al. |
| 2016/0380353 A1 | 12/2016 | Lysejko et al. |
| 2016/0380354 A1 | 12/2016 | Bozier et al. |
| 2016/0380355 A1 | 12/2016 | Lysejko et al. |
| 2016/0380363 A1 | 12/2016 | Logothetis |
| 2016/0381570 A1 | 12/2016 | Lysejko et al. |
| 2016/0381585 A1 | 12/2016 | Dudzinski et al. |
| 2016/0381590 A1 | 12/2016 | Lysejko et al. |
| 2016/0381591 A1 | 12/2016 | Lysejko et al. |
| 2016/0381698 A1 | 12/2016 | Grinshpun et al. |
| 2017/0111181 A1 | 4/2017 | Zhou |
| 2017/0280314 A1 | 9/2017 | Yang et al. |

FOREIGN PATENT DOCUMENTS

| | | |
|---|---|---|
| EP | 0654915 A2 | 5/1995 |
| EP | 1903348 A1 | 3/2008 |
| EP | 2113145 A1 | 11/2009 |
| EP | 2207267 A2 | 7/2010 |
| EP | 2391157 A2 | 11/2011 |
| EP | 2448144 A1 | 5/2012 |
| EP | 2506625 A1 | 10/2012 |
| EP | 2538712 A1 | 12/2012 |
| GB | 2318914 A | 5/1998 |
| GB | 2484377 A | 4/2012 |
| JP | H05188128 A | 7/1993 |
| JP | H06188802 A | 7/1994 |
| KR | 101346062 B1 | 12/2013 |
| WO | 9426001 A1 | 11/1994 |
| WO | 199965105 A1 | 12/1999 |
| WO | 0152447 A2 | 7/2001 |
| WO | 0231908 A2 | 4/2002 |
| WO | 03096560 A1 | 11/2003 |
| WO | 2004095764 A2 | 11/2004 |
| WO | 2004114546 A1 | 12/2004 |
| WO | 2005064967 A1 | 7/2005 |
| WO | 2007010274 A1 | 1/2007 |
| WO | 2007069809 A1 | 6/2007 |
| WO | 2008/064696 A1 | 6/2008 |
| WO | 2008111882 A1 | 9/2008 |
| WO | 2008151057 A2 | 12/2008 |
| WO | 2010077790 A1 | 7/2010 |
| WO | 2011044947 A1 | 4/2011 |
| WO | 2011060058 A1 | 5/2011 |
| WO | 2014106539 A1 | 7/2014 |

OTHER PUBLICATIONS

PCT Search Report from PCT/GB2016/051285, dated Jul. 13, 2016, 12 pgs.
PCT Search Report from PCT/GB2016/051195, dated Jul. 25, 2016, 13 pgs.
PCT Search Report from PCT/GB2016/051205, dated Jul. 25, 2016, 13 pgs.
Doi et al., "Low-Cost Antenna Array Via Antenna Switching for High Resolution 2-D DOA Estimation," SIPS 2013 Proc. IEEE, Oct. 16, 2013, pp. 83-88.
Jung et al., "Attitude Sensing Using a GPS Antenna on a Turntable: Experimental Tests," Navigation, J. of the Institute of Navigation, Fairfax, VA, US, vol. 51, No. 3, Dec. 1, 2004, pp. 221-230.
PCT Search Report from PCT/GB2016/051234 (corresponding to U.S. Appl. No. 15/187,570), dated Aug. 5, 2016, 13 pgs.
PCT Search Report from PCT/GB2016/051360 (corresponding to U.S. Appl. No. 15/187,900), dated Aug. 19, 2016, 12 pgs.
PCT Search Report from PCT/GB2016/051615 (corresponding to U.S. Appl. No. 15/187,515), dated Aug. 12, 2016, 13 pgs.
PCT Search Report from PCT/GB2016/051617 (corresponding to U.S. Appl. No. 15/187,616), dated Aug. 23, 2016, 11 pgs.
PCT Search Report from PCT/GB2016/051618 (corresponding to U.S. Appl. No. 15/187,602), dated Aug. 12, 2016, 12 pgs.
PCT Search Report from PCT/GB2016/051759 (corresponding to U.S. Appl. No. 15/187,680), dated Sep. 14, 2016, 15 pgs.
Office Action in related U.S. Appl. No. 15/186,134 dated Nov. 22, 2016, 18 pages.
PCT Search Report from PCT/GB2016/051428 (corresponding to U.S. Appl. No. 15/187,188), dated Dec. 13, 2016, 19 pgs.
U.S. Notice of Allowance from U.S. Appl. No. 15/186,134 dated Mar. 14, 2017, 8 pages.
U.S. Office Action in U.S. Appl. No. 15/182,209 dated Apr. 13, 2017, 17 pages.
PCT Written Opinion from PCT/GB2016/051195, dated May 17, 2017, 5 pgs.
PCT Written Opinion from PCT/GB2016/051205, dated May 16, 2017, 5 pgs.
PCT Written Opinion from PCT/GB2016/051234, dated May 17, 2017, 10 pgs.
PCT Written Opinion from PCT/GB2016/051285, dated May 10, 2017, 5 pgs.
PCT Written Opinion from PCT/GB2016/051360, dated Jun. 1, 2017, 6 pgs.
PCT Written Opinion from PCT/GB2016/051428, dated Jun. 2, 2017, 12 pgs.
PCT Written Opinion from PCT/GB2016/051615, dated May 17, 2017, 5 pgs.
PCT Written Opinion from PCT/GB2016/051759, dated May 18, 2017, 6 pgs.
Office Action in related U.S. Appl. No. 15/187,680 dated Nov. 3, 2017, 8 pages.
UK Search Report from GB 1514938.8, dated Apr. 18, 2016, 4 pgs.
UK Search Report from GB 1516901.4, dated Mar. 18, 2016, 5 pgs.
UK Search Report from GB 1518654.7, dated Mar. 24, 2016, 3 pgs.
UK Search Report from GB 1519216.4, dated Apr. 15, 2016, 5 pgs.
UK Search Report from GB 1519220.6, dated Apr. 4, 2016, 4 pgs.
UK Search Report from GB 1519228.9, dated Apr. 29, 2016, 4 pgs.
UK Search Report from GB 1519270.1, dated Apr. 25, 2016, 5 pgs.
UK Search Report from GB 1519272.7, dated Jun. 10, 2016, 3 pgs.
UK Search Report from GB 1519273.5, dated Apr. 27, 2016, 3 pgs.
Office Action in related U.S. Appl. No. 15/187,515 dated Dec. 7, 2017, 9 pages.

(56) References Cited

OTHER PUBLICATIONS

U.S. Appl. No. 15/187,570—Office Action dated Feb. 27, 2018, 16 pages.
U.S. Appl. No. 15/187,602—Office Action dated Feb. 22, 2018, 19 pages.
U.S. Notice of Allowance from U.S. Appl. No. 15/182,209 dated Nov. 22, 2017, 13 pages.
U.S. Notice of Allowance from U.S. Appl. No. 15/187,616 dated Jan. 9, 2018, 12 pages.

\* cited by examiner

NODE ROLE ASSIGNMENT IN NETWORKS

CROSS-REFERENCE TO OTHER APPLICATIONS

This application claims priority under 35 U.S.C. 119(b) to UK Application No. 1511200.6, filed 25 Jun. 2015 and entitled "STEERABLE ANTENNA SYSTEM", and to UK Application No. 1518654.7, filed 21 Oct. 2015 and entitled "NODE ROLE ASSIGNMENT IN NETWORKS". Both applications are incorporated by reference herein.

BACKGROUND

The present technique relates to the field of networking. In particular, the present technique is concerned with the assignment of roles to nodes in networks.

In a network, a node may be assigned a particular role in functioning of the network. For example, it has previously been proposed to use a wireless feeder network to provide an access network, which is made up of access base stations to which user equipment connects, with access to a communications network via a wireless backhaul. This can be achieved by providing wireless relay stations between the communications network and the access base stations that serve the user equipment. In such a situation, the wireless backhaul may be provided by a combination of feeder base stations on the communications network side, and feeder terminals on the access network side.

However, it may not always be clear which role a node should adopt. Furthermore, the configuration of the role can differ depending on which role the node takes and it is not always clear what the configuration of the node should be. Considering again the scenario of a wireless feeder network, it may not be immediately clear whether a node should act as a feeder base station or as a feeder terminal. Furthermore, complex configuration may be required depending on which role the node takes. For example, if the node is to be feeder base station, then the node could be required to make itself available to particular feeder terminals. Similarly, if the node is to be made a feeder terminal, then it may be obliged to connect to a particular feeder base station. Where wireless communications are used, interference can also become a problem. Hence, it may be desirable to connect nodes to the network in such a way that interference or the effects thereof are reduced.

It may be possible to pre-plan a network configuration such that the role and configuration of each node is predetermined. However, pre-planning the network becomes more complex and less accurate as more devices are added to the network—which may cause unpredictable levels of interference or congestion to the network. Furthermore, it is often very difficult or even impossible to anticipate local phenomena. For example, it might not be possible to determine that the structure or shape of a building makes it difficult for a pair of nodes to reliably communicate with each other. As another example, at a time when a node is to be added to the network it could be discovered that a wired connection, which was relied upon in the network plan, is non-operational or non-existent.

It is also possible for an engineer to perform network analysis at the time that a node is to be added to the network in order to determine a suitable location and appropriate configuration for the node, in order to enhance the network rather than to reduce its efficacy. However, this often requires specialist equipment and expertise.

It is therefore desirable for a user to be able to add nodes to a network in such a way that the role of a node is determined dynamically, without particular expertise being required by the user.

Viewed from a first example configuration, there is provided a node for use in a network, the node comprising: communication circuitry to communicate with a management server; bootstrap circuitry to initially identify an intermediate node from at least one available node in the network in response to the communication circuitry being unable to communicate with the management server directly, wherein the communication circuitry is arranged to communicate with the management server indirectly via the intermediate node when unable to communicate with the management server directly; and role assignment circuitry to assign a role to be performed by the node in the network based on whether the communication circuitry communicates with the management server directly, or indirectly via an intermediate node.

Viewed from a second example configuration, there is provided a method of operating a node, the method comprising the steps: attempting to communicate with a management server directly; in response to the node being unable to communicate with the management server directly, identifying an intermediate node from at least one available node in the network and communicating with the management server indirectly assigning a role to be performed by the node in the network based on whether the node communicates with the management server directly, or indirectly via an intermediate node.

Viewed from a third example configuration, there is provided a node for use in a network, the node comprising: communication means for communicating with a management server; bootstrap means for initially identifying an intermediate node from at least one available node in the network in response to the communication means being unable to communicate with the management server directly, wherein the communication means is arranged to communicate with the management server indirectly via the intermediate node when unable to communicate with the management server directly; and role assignment means for assigning a role to be performed by the node in the network based on whether the communication means communicates with the management server directly, or indirectly via an intermediate node.

BRIEF DESCRIPTION OF THE DRAWINGS

The present technique will be described further, by way of example only, with reference to embodiments thereof as illustrated in the accompanying drawings, in which.

Figure 1:
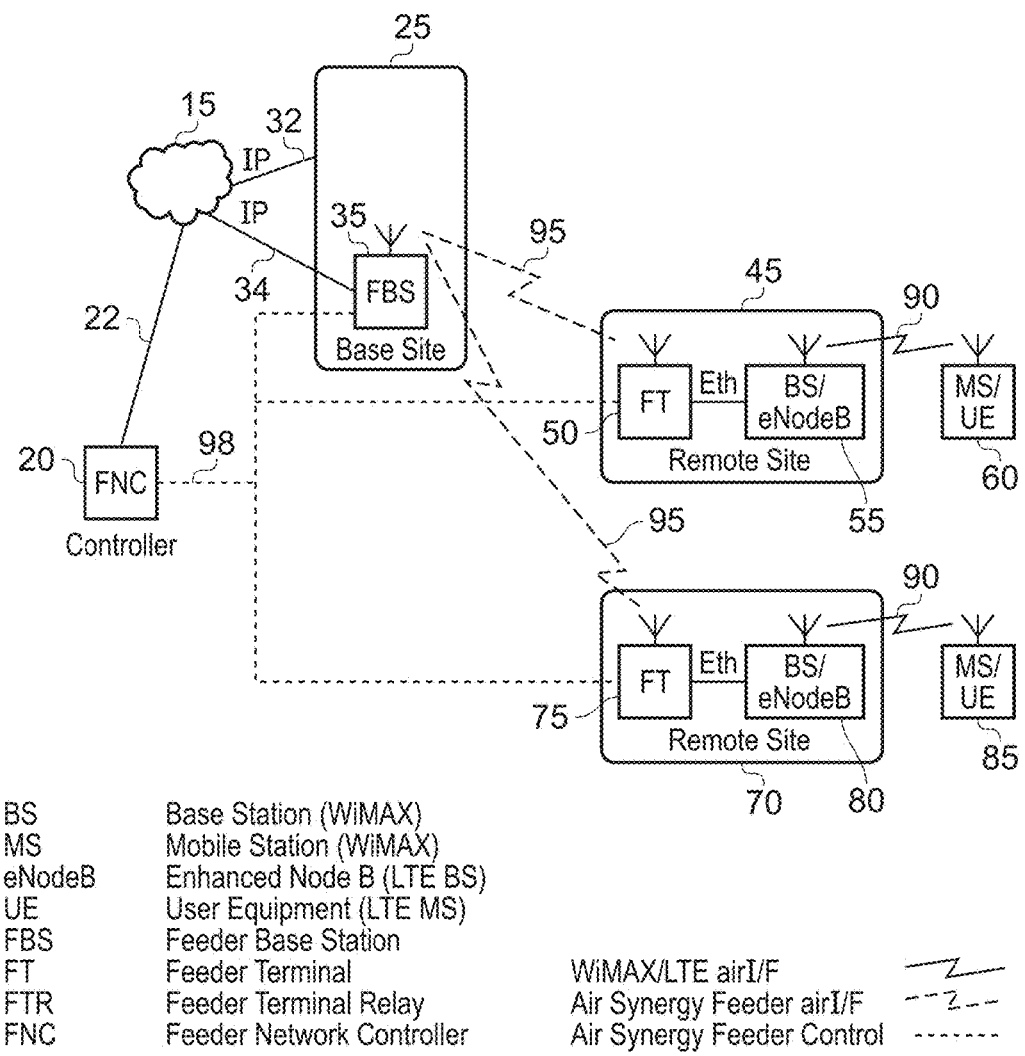
FIG. 1 schematically illustrates a wireless feeder network.

Before discussing the embodiments with reference to the accompanying figures, the following description of embodiments and associated advantages is provided.

In accordance with one example configuration there is provided a node for use in a network, the node comprising: communication circuitry to communicate with a management server; bootstrap circuitry to initially identify an intermediate node from at least one available node in the network in response to the communication circuitry being unable to communicate with the management server directly, wherein the communication circuitry is arranged to communicate with the management server indirectly via the intermediate node when unable to communicate with the management server directly; and role assignment circuitry to assign a role to be performed by the node in the network based on whether the communication circuitry communicates with the management server directly, or indirectly via an intermediate node.

An individual node is capable of acting in a variety of different roles in the network. When activated, the node will initially attempt to contact the management server directly. However, if the node is unsuccessful, then the bootstrap circuitry will identify an intermediate node (e.g. a feeder base station) that is to be used as an intermediary for the node to communicate to the management server. The node's role is then determined based on whether the node was able to communicate with the management server directly or whether the node was required to use an intermediate node in order to establish communication with the management server. Accordingly, a node can be set up and made to communicate with the management server with very little effort by an operator, in order to determine its role. In particular, the operator can assemble the network without knowledge of the network's configuration or topology. Furthermore, the node may be able to adapt to unanticipated interference since, if a node cannot directly connect to the management server, it will select an intermediate node that allows such a connection to the management server to be made, albeit indirectly.

In some embodiments, the node further comprises storage circuitry to store a list of intermediate nodes and associated priorities received from the management server in response to the node communicating with the management server indirectly; selection circuitry to select the intermediate node from the prioritised list of intermediate nodes based on the associated priorities, wherein the communication circuitry is to perform further communication with the management server indirectly via the intermediate node selected from the prioritised list of intermediate nodes. In these embodiments, when the node contacts the server indirectly (i.e. through an intermediate node), the node receives a list of intermediate nodes together with associated priorities of those nodes. In other words, the node receives a prioritised list of nodes. This list is stored in storage circuitry (which may be non-volatile storage such as a hard disk or volatile storage such as RAM). The selection circuitry uses the prioritised list in order to select a new intermediate node. For example, the selection circuitry selects the node at the top of the prioritised list (if the node at the top of the list is unavailable, then the next highest node is selected and so on). The communication circuitry then performs further communication with the management server via the new intermediate node. Consequently, the bootstrapping circuitry can be used to select an initial intermediate node, with which to make contact with the management server. Once the node makes contact with the management server, the management server is able to inform the node as to the most suitable intermediate node or nodes to use. This information may take into account other factors such as the loading of intermediate nodes in the network, their geographic location and potential interference. Hence, the list of prioritised nodes sent by the management server can represent a more informed decision regarding intermediate nodes for the node to use, and further communication with the management server can then take place via an intermediate node selected from the list. It is of course possible that the node selected from the prioritised list will correspond with the node selected by the bootstrap circuitry.

In some embodiments, the communication circuitry comprises: wireless communication circuitry to communicate with the intermediate node wirelessly. The wireless communication circuitry is used, in these embodiments, when communication with the management server must be achieved indirectly. There are numerous possibilities regarding what form the wireless communication circuitry may take. However, in some embodiments, the wireless communication circuitry is an antenna array.

In some embodiments, the communication circuitry comprises: wired communication circuitry to communicate directly with the management server. The wired communication circuitry is used, in these embodiments, when communication with the management server is achieved directly.

In some embodiments, in response to the node communicating with the management server, the node receives configuration data from the management server. The configuration data is used in order to specify exactly how the node is to operate. By providing this data from the management server, it is possible to provide configurations to nodes based on information that may not be discernible by an individual node. For example, the management server may be aware of the entire network, rather than merely the local area surrounding a node or even just the node itself. By using this more complete data, it is possible for the node to be configured in such a manner that the overall network performance is improved.

In some embodiments, the configuration data comprises firmware. Hence, when the node manages to communicate with the management server, the node will receive new firmware that controls how the node works. The firmware may be customised to the particular network being set up and/or may be used to propagate bug fixes to previous versions of the software (e.g. the software with which the node is initially configured).

In some embodiments, the configuration data comprises an indicator of whether the node should act as a point-to-point node or as a point-to-multipoint node. A point-to-point node relays data from one node A to one other node B (and from B back to A). Conversely a point-to-multipoint node relays data from one node C to a plurality of N (N≥2) other nodes and from the plurality of N other nodes back to the single node C. By providing configuration data indicating whether a node should operate as a point-to-point or point-to-multipoint node, it is possible to dynamically specify the connectivity of the network and how multiple nodes communicate with the management server. For example, the indication of whether an intermediate node should operate as a point-to-point node or a point-to-multipoint node can indicate the number of other nodes (e.g. feeder terminals) that can connect to that intermediate node (e.g. feeder base station).

In some embodiments, the configuration data comprises an indication of an RF frequency; and the antenna array is to operate in accordance with the RF frequency. The configuration data may therefore indicate at which frequency the antenna array is to operate. On receiving the configuration data, the antenna array then carries out further communication at that particular frequency. This may allow a network (or portions of a network) to operate at different frequencies in order to avoid interference that exists at another frequency.

In some embodiments, the configuration data comprises an indication of beam width; and the wireless communication circuitry is to shape a transmission beam width based on the beam width. Beam shaping is a technique that may be used to control the manner in which a transmission radiates from the node. For example, a wide beam width may be used in order to improve the dispersal of a signal whilst a narrow beam width may be used to more careful control the direction of the signal dispersal, e.g. to avoid interference at other nodes. In these embodiments, data relating to the beam width is received from the management server, which may be selected in order to prevent or reduce interference caused at other nodes.

In some embodiments, the wireless communication circuitry is rotatable; the configuration data comprises direction data; and the wireless communication circuitry is to rotate based on the direction data. In these embodiments, the communication circuitry may rotate in order to enable the receiving or transmitting of data from/to a particular direction.

There are a number of ways in which the role of a node may be assigned to that node. In some embodiments, the role assignment circuitry selects and assigns the role to be performed by the node based on whether the communication circuitry communicates with the management server directly or indirectly via an intermediate node. Accordingly, the node itself determines its role based on whether or not an intermediate node was required to reach the management server. Once determined, this role is then adopted by the node.

In other embodiments, however, the role assignment circuitry assigns the role to be performed by the node in response to a control signal from the management server; and the control signal is based on whether the communication circuitry communicates with the management server directly or indirectly via an intermediate node. For example, on communicating with the management server, the management server may determine whether or not the communication is direct or indirect (via an intermediate node). Depending on this determination, the management server itself sends a control signal back to the node, indicating which role the node should adopt. This is then put into effect by the role assignment circuitry.

There are a number of ways in which the bootstrap circuitry may initially identify the intermediate node from the at least one available node in the network. In some embodiments, the bootstrap circuitry initially identifies the intermediate node from the at least one available node in the network based on at least one of: a received signal strength indicator, and an average bandwidth in relation to each of the at least one available node in the network. The received signal strength indicator (RSSI) and the average bandwidth are indicators of a stable connection in which data can be efficiently transmitted. By initially identifying the intermediate node based on these factors, it is possible to select an intermediate node that is likely to enable an effective connection between the node and the management server In some embodiments, the node comprises a location receiver to receive a signal indicative of a location of the location receiver; and in response to the node communicating with the management server, the node transmits the location of the location receiver to the management server. The location receiver could, for example, be capable of receiving a navigation system signal, such as a satellite based global navigation system signal, e.g. a GPS signal. This can be used to accurately determine the location of the node. When a direct or indirect connection is established between the node and the management server, the node can transmit this information to the management server. In cases where the node must connect indirectly to the management server, the management server may use this information to determine which nearby nodes may be suitable to act as an intermediate node.

In some embodiments, the role assignment circuitry is to assign the role to be performed by the node in the network further based on the location of the location receiver. In these embodiments, whether or not the node is able to directly connect to the management server can be used to determine an initial role for the node, in order to enable a connection to the management server. Thereafter, the node's role is determined based on the node's position. In some of these embodiments, the node is considered to have a particular location if the node is within a predetermined distance (e.g. 1 meter) of that location. For example, a configuration can be associated with a particular set of coordinates and the node can be given that configuration if the node is within 1 meter of those coordinates. In this way, a node's role can be centrally determined. Furthermore, roles can be established such that a particular location has a node of a required role.

In some embodiments, the role assignment circuitry is to assign the role to be performed by the node in the network further based on an id of the node. For example, a node with a particular id can be assigned a specific configuration. Such a process can be used to avoid ambiguity with regards to which role a particular node should adopt.

In some embodiments, the node is to provide wireless backhaul to items of end-user equipment.

In some embodiments, the role assignment circuitry assigns the node a role of intermediate node when the communication circuitry communicates with the management server directly; and the role assignment circuitry assigns the node a role of feeder terminal when the communication circuitry communicates with the management server indirectly via an intermediate node. For example, in some embodiments, when the role assigned to the node is intermediate node, the node is to provide wireless backhaul to a further node having a role of feeder terminal; and when the role assigned to the node is feeder terminal, the node is to provide the wireless backhaul from the intermediate node to an access base station to which items of end-user equipment connect. Note that a backhaul hub itself can, in some embodiments, also provide wireless backhaul to a base station to which items of end-user equipment connect.

In some embodiments, there is provided a network comprising a plurality of nodes; and the management server, wherein the plurality of nodes includes the intermediate node to directly communicate with the management server; and the plurality of nodes includes a further node to indirectly communicate with the management server via the intermediate node.

Particular embodiments will now be described with reference to the figures.

FIG. 1 is a block diagram schematically illustrating a network architecture including a wireless feeder network in accordance with one embodiment. As shown in FIG. 1, a number of access base stations 55, 80 are provided in the conventional manner to communicate via a wireless air interface 90 with a number of mobile stations/items of end user equipment 60, 85. Whilst for simplicity, each base station 55, 80 is shown as communicating with a single item of end user equipment, it will be appreciated that in practice such base stations form point-to-multipoint devices enabling a plurality of items of end user equipment to communicate with an individual base station. The items of end user equipment may be mobile or fixed, and any one of a number of known wireless communication protocols may be used to effect the wireless links 90. For example, in one embodiment such wireless links may be constructed using WiMAX or LTE air interfaces.

Each base station is provided with a backhaul connection to the communications infrastructure 15. Base stations 55, 80 can be coupled to the communications infrastructure 15 via a wireless feeder network consisting of a plurality of feeder base stations 35 coupled to the communications infrastructure 15, and a plurality of feeder terminals 50, 75 coupled to associated access base stations. The feeder base stations 35 and feeder terminals 50, 75 communicate via a feeder air interface 95. Each feeder base station (FBS) forms a wireless point-to-point or point-to-multipoint hub, which provides connectivity between a wired infrastructure and remote sites 45, 70. Each feeder terminal provides the feeder end-point functionality. Accordingly, it terminates the feeder wireless link and, in the first instance, provides an interface to one or more co-located access base stations. Whilst the locations in which the feeder base stations and feeder terminals are located may be varied, in one example the feeder base stations will typically be installed on a tower or building roof-top whilst the feeder terminals will typically be installed either below the roof-line, on a building, or on street furniture, such as a lamp post or utility pole.

In accordance with the architecture illustrated in FIG. 1, a number of base sites and a number of remote sites are established. A base site 25 receives a wired backhaul connection 32, 34 and in the example base site 25 illustrated in FIG. 1, the base site includes a feeder base station 35.

Each remote site 45, 70 includes a feeder terminal 50, 75 and an associated access base station 55, 80. In one embodiment, the feeder terminal and associated access base station are physically separate devices, and may be coupled to each other via a variety of connections, for example an Ethernet connection such as shown in FIG. 1. In an alternative embodiment, the feeder terminal and access base station may be incorporated into a single unit used to form a remote site.

A feeder network controller 20, which is an example of a management server, is used to control the wireless feeder network. The dotted line 98 in FIG. 1 illustrates this logical control of the feeder network controller 20 over the various elements of the wireless feeder network. In practice, the control messages are routed to the various feeder base stations 35 and feeder terminals 50, 75 via the wired backhaul connections 22, 34 and the feeder links provided by the feeder air interface 95. Accordingly, the feeder base stations act as intermediate nodes between the feeder network controller and the feeder terminals. The feeder network controller is responsible for configuring the wireless feeder network.

Figure 2:
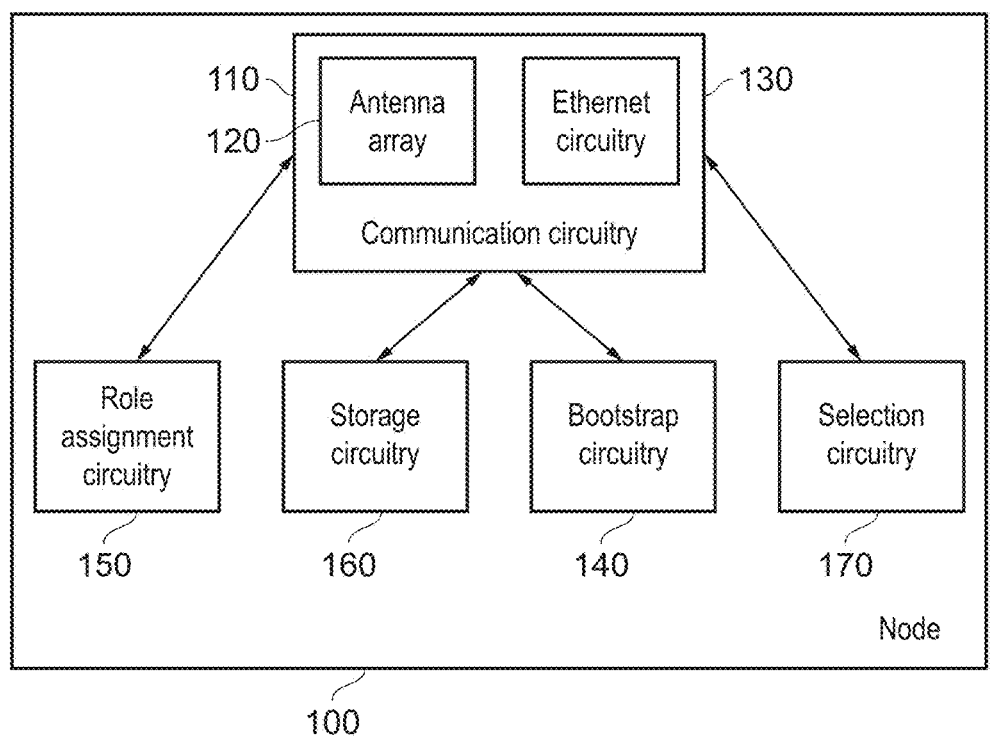
FIG. 2 schematically illustrates a node in accordance with one embodiment.

FIG. 2 illustrates a node 100 in accordance with one embodiment. The node is not pre-configured as either a feeder base station or a feeder terminal, but is capable of operating in either role depending on the situation when it is set up. The node comprises communication circuitry 110. In this embodiment, the communication circuitry includes wireless communication circuitry in the form of an antenna array 120, as well as wired communication circuitry in the form of Ethernet circuitry 130. Note, however, that in other embodiments, the communication circuitry may only include wired communication circuitry (through which it may be connected to a number of other devices). In such cases, if direct communication with the management server is not possible, then it is still necessary for the node to communicate with the management server via an intermediate node. In still other embodiments, only wireless communication circuitry is provided as part of the communication circuitry. In any event, the communication circuitry 110 is responsible for communicating with a management server (such as an FNC as previously discussed). This communication may take place directly, or indirectly via an intermediate node such as via a feeder base station. The node additionally includes bootstrap circuitry 140. The bootstrap circuitry is used in the event that the node is unable to directly communicate with the management server. In such a case, the bootstrap circuitry considers all available nearby nodes that may act as an intermediate node, and makes an initial selection in order to enable communication between the node and the management server. Role assignment circuitry 150 is used to assign a role of the node based on whether or not the node was able to directly communicate with the management server or whether it was only able to communicate with the management server indirectly.

In the embodiment of FIG. 2, the node additionally comprises optional storage circuitry 160. In this embodiment, when the node 100 makes contact with the management server indirectly, the management server will transmit a prioritised list of intermediate nodes. This list is stored in the storage circuitry (which may be, for example, volatile storage such as RAM or non-volatile storage such as a hard disk). Having stored data in the storage circuitry, optional selection circuitry 170 then makes a selection, from the prioritised list, of an intermediate node to use for further communication with the management server. From that point forward, communication between the node and the management server takes place using the selected intermediate node. The prioritised list of intermediate nodes received from the server may take into account a number of factors that may not be known to the node 100. For example, the management server may be aware of the extent to which nearby intermediate nodes are already loaded. A further consideration may be whether the communication between the node 100 and the initially selected intermediate node is likely to cause interference to other nodes, which could be reduced if the node 100 were to communicate with the management server via a different intermediate node. Accordingly, by providing a prioritised list of intermediate nodes, the selection circuitry 170 is able to attempt to reach each in turn, starting with the highest priority intermediate node and working down. Note that in other embodiments, the storage circuitry 160 and the selection circuitry 170 are not present.

Figure 3:
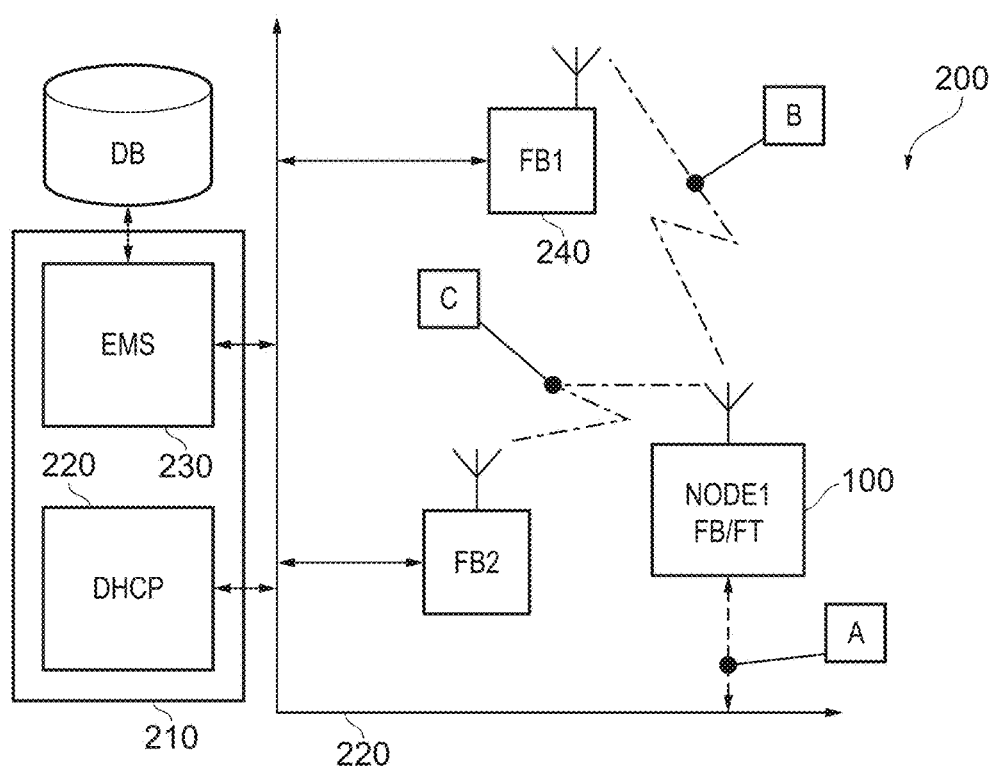
FIG. 3 illustrates the process of a node connecting to a wireless feeder network and becoming a feeder terminal in accordance with one embodiment.

FIG. 3 illustrates an embodiment comprising a node 100 that connects to a network 200.

In this embodiment, at step A, the node attempts to connect to a management server 210 via a wired interface 220. In other embodiments the node attempts to make a direct connection to the management server wirelessly, while in yet other embodiments, the node attempts to make a direct connection to the management server either via a wired interface or wirelessly. In this embodiment, the management server is made up of a Dynamic Host Configuration Protocol (DHCP) server 220, and an Element Management System (EMS) server 230. If the node is unable to connect to the management server, e.g., if the node is not connected to the wired interface then the node will search for nearby intermediate nodes (feeder base stations) through which it can connect to the management server. In this embodiment, the search is carried out using wireless communication circuitry. In other words, having failed to establish a direct wired connection to the management server, the node will attempt to wirelessly connect to an intermediate node. Note that in other embodiments, the selection of an intermediate node may use both wired communication circuitry and wireless communication circuitry.

At step B, the node selects an intermediate node/feeder base station 240. This selection is made by the bootstrap circuitry 140, and the selection may be based on: cell ID, communication direction, bandwidth, Received Signal Strength Indicator (RSSI), Carrier to Noise and Interference Ratio (CINR), Multiple Input and Multiple Output (MIMO) mode, MIMO rank, SNR equivalent rate (the maximum throughput rate that can be achieved using the best Modulation and Coding Scheme for the specified signal to noise ratio, measured in bits per second per Hz), or any combination thereof. These particular factors may be useful in quickly determining a prima facie assessment of the quality of link that can be expected between the node and the intermediate node and so may be helpful in helping the node to establish a good quality initial connection with the management server.

Once a connection with the management server has been achieved, the node's initial role is determined. In this embodiment, the node sets its own role based on how it connected to the management server (directly or indirectly). However, in other embodiments, the management server transmits a control signal to the node once a connection is established. The control signal causes the node to allocate its role based on the control signal that is received. Taking this scenario as an example, the management server would transmit a control signal to the node that causes the node to adopt a role of feeder terminal, because the node connected indirectly to the management server (e.g. wirelessly via an intermediate node).

Once a connection with the management server has been obtained, the management server transmits configuration data to the node. For example, the DHCP server 220 assigns an IP address to the node and provides an IP address for the EMS server. This allows IP communication to be established with the EMS server, which transmits replacement firmware for the node, thus allowing network specific software or updated software to be sent to the node. The configuration data can include an indication of whether the node should act as a point-to-point node or a point-to-multipoint node. For example, a feeder base station can be configured to only connect to a single feeder terminal or to multiple feeder terminals. In some embodiments, the configuration data includes configuration data relating to the node's wireless communication circuitry. For example, the management server directs a node to use a particular RF frequency, beam width, beam shape, or to transmit in a particular direction by either directing the beam at a particular angle or potentially be rotating the antenna array. Similarly, once a connection has been established with the management server, the node transmits data to the management server. For example, the node can transmit data relating to its location (receivable via, for example, a GPS receiver) to the management server. This can be used by the management server to determine potential sources of interference or can be used by the management server to search for suitable nearby intermediate nodes/feeder base stations for the feeder terminal node to use.

In any event, in this embodiment, at step C, the management server sends the node a prioritised list of intermediate nodes to use. This prioritised list can be based on information that is available to the management server that is not available to the node itself. For example, the management server could be aware that the intermediate node 240 to which the node is already connected is heavily congested. When the node receives this list, it uses the list to reselect its intermediate node. In this example, the topmost node in the prioritised list is new intermediate node 250 (FB2). Accordingly, the node connects to the management server via new intermediate node 250 (FB2). Further communication with the management server then occurs via the new intermediate node.

Figure 4:
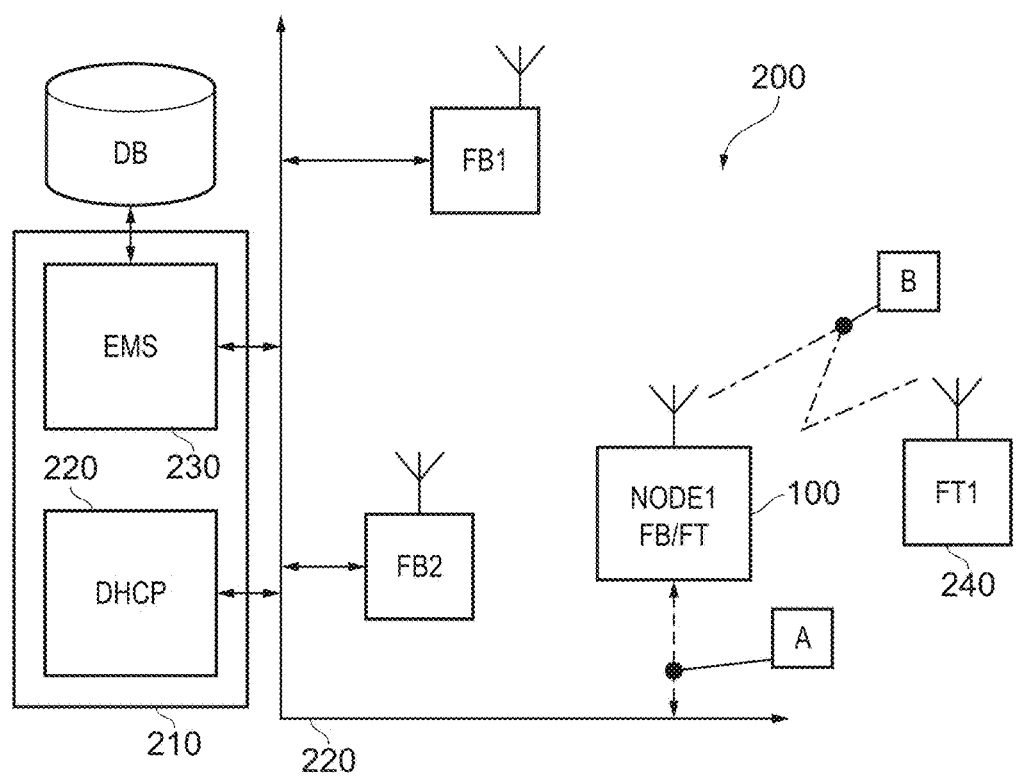
FIG. 4 illustrates the process of a node connecting to a wireless feeder network and becoming a feeder base station (which is an example of a intermediate node) in accordance with one embodiment.

FIG. 4 illustrates the situation in which the same node 100 successfully connects to the management server 210 via the wired interface 220 at step A. In this case, since the node has successfully directly connected to the management server 210, the node is assigned a role of intermediate node (feeder base station). Accordingly, at a step B, a further (feeder terminal) node is able to use the node 100 in order to connect to the management server—either as an initial intermediate node or as the intermediate node to be used after a prioritised list of intermediate nodes is received by the feeder terminal 240 after connecting to the management server 210.

Figure 5:
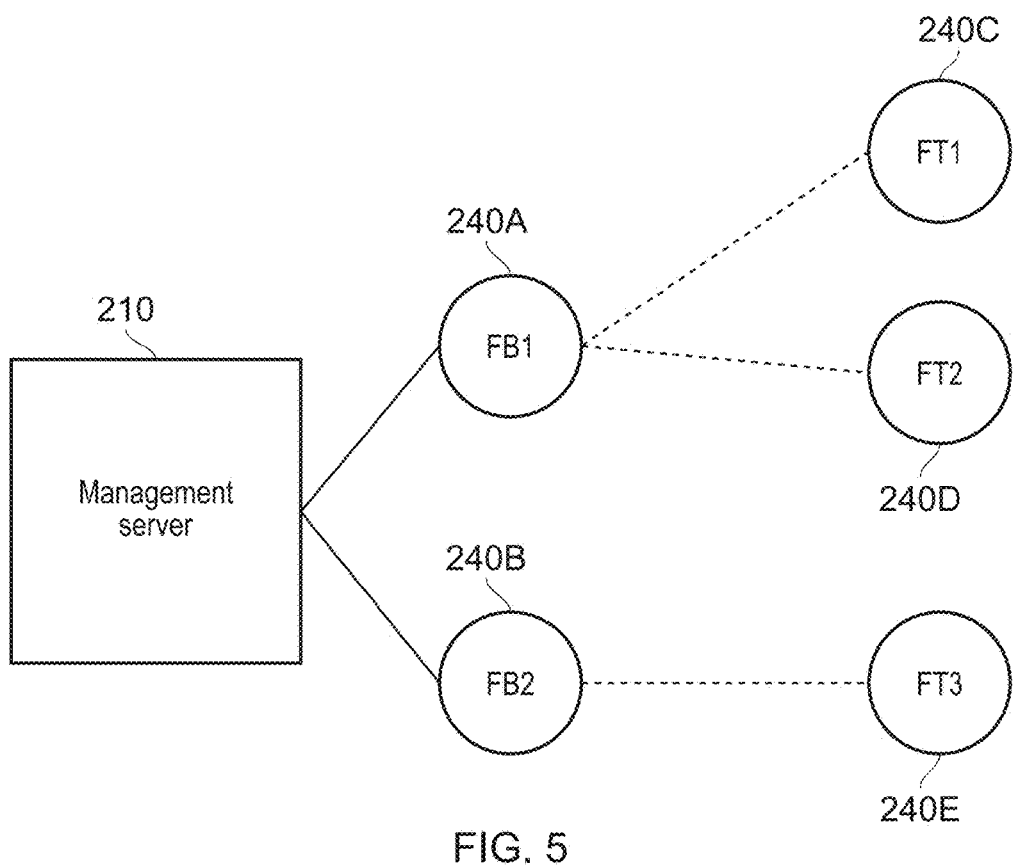
FIG. 5 illustrates an example of configuring a network comprising nodes in accordance with one embodiment.

FIG. 5 illustrates an example in which nodes 240A, 240B that are directly connected to the management server 210 become feeder base stations (intermediate nodes). In this example, FB1 240A receives configuration information from the management server 210 to indicate that it should operate as a point to multipoint node. Conversely, FB2 240B receives configuration information from the management server 210 to indicate that it should operate as a point to point node. In due course, when further nodes 240C, 240D, 240E are activated, the further nodes must connect to the management server 210 via an intermediate node, because they are not directly connected to the management server 210. A maximum of one of these further nodes can connect to node FB2 240B because node FB2 240B is a point to point node. However, any number of the further nodes can connect to FB1 240A because node FB1 240A is a point to multipoint node.

Figure 6:
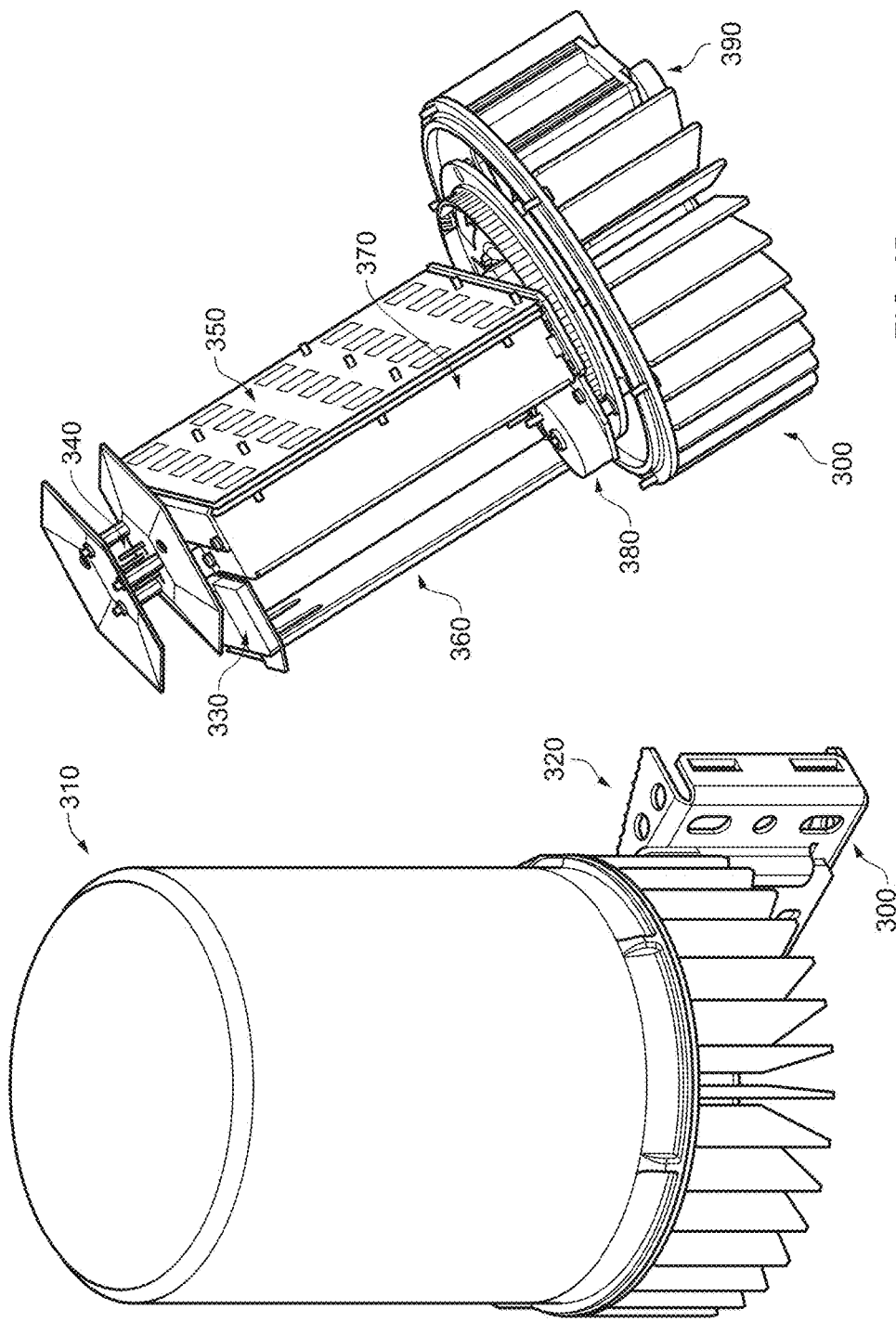
FIGS. 6A and 6B show an exterior and interior view of a node in accordance with one embodiment.

FIGS. 6A and 6B illustrate an example of a node 300, in accordance with one embodiment, in a sealed and unsealed form, respectively. In FIG. 6A the node is sealed with a cover or radome 310 and includes a mounting bracket 320 for mounting the node to a fixed structure. FIG. 6B shows the node 300 with the radome removed. The node includes a GPS receiver 330, which is used to determine a location of the node. The wireless communication circuitry on the node includes a triple-monopole direction-finding beacon antenna 340, which can be used in order to determine the presence and direction of possible intermediate nodes. A front antenna array 350 and rear antenna array 360 are also included. The antenna arrays are designed such that a shape and size of a transmission beam can be dynamically adjusted. For example, the transmission beam can be made to radiate outwards at 75 degrees. By deactivating some of the elements of the array, the beam width is reduced to 25 degrees. Deactivating still further elements of the array reduces the beam width to 15 degrees. Reducing the beam width makes it possible to direct a transmission more precisely, thereby including targets that are desirable while reducing interference to other devices. Alternatively, increasing the beam width makes it possible to widely disseminate a signal or transmission. Within the node, much of the circuitry 370, such as the storage circuitry is stored behind the antenna. A rotation mechanism 380 is also provided in order to enable the antenna array to be rotated, thereby improving the degree to which a beam can be directed. Wired communication circuitry in the form of an Ethernet interface 390 is also provided.

Figure 7:
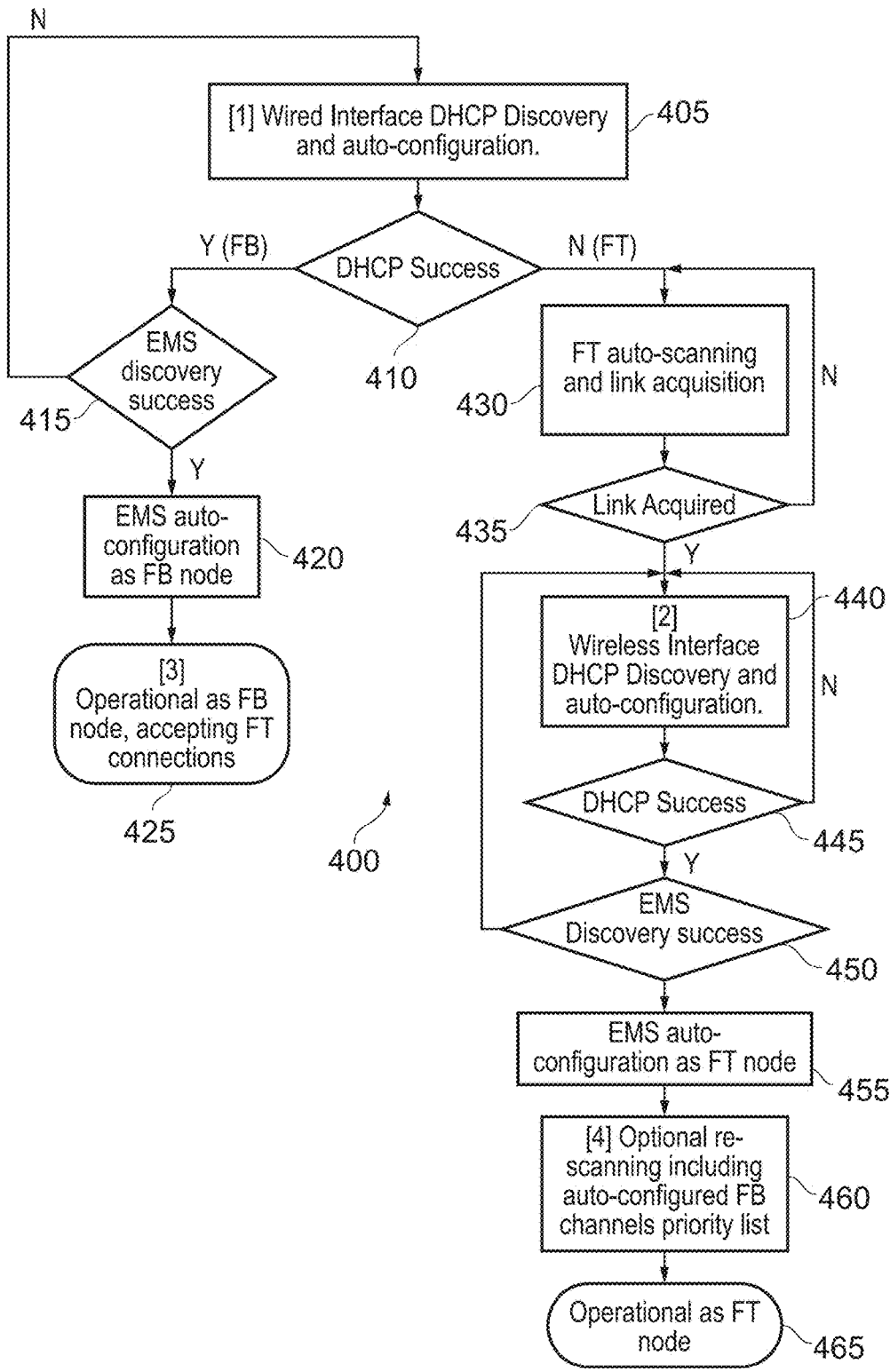
FIG. 7 illustrates a flowchart illustrating the process of a node connecting to a wireless feeder network in accordance with one embodiment.

FIG. 7 shows a flowchart 400 illustrating a process of connecting a node to a network in accordance with one embodiment. At step 405, the node attempts to use the wired interface in order to communicate with the DHCP server. At step 410, it is determined whether or not the connection attempt succeeded. If the attempt succeeded then the node attempts to contact the EMS server. If unsuccessful, the flow returns to step 405. Otherwise, the flow continues to step 420. Accordingly, steps 405, 410, and 415 correspond with the step of attempting to directly communicate with the management server. If the process succeeds then at step 420, the EMS server configures the node as a feeder base station (FB) node. This is achieved by transmitting a control signal to the node in order to cause the role assignment circuitry 150 within the node to assign itself a role of 'feeder base station' (or 'intermediate node'). The node then becomes operational as a feeder base station node, accepting connections from feeder terminal nodes at step 425. If the attempt to contact the DHCP server at step 410 is unsuccessful then it is concluded that the node is not directly connected to the management server and that an intermediate node (e.g. a feeder base station) must be used in order to communicate with the management server. At step 430, the node wirelessly scans for available nodes in the network that can act as an intermediate node. At step 435 a link with one such node is acquired. This selection may be based on a variety of different criteria as previously discussed. At step 440, contact with the DHCP server is made, wirelessly, via the intermediate node with which a link was acquired. If, at step 445, this process is successful then an attempt is made to contact the EMS server. If, at step 450, this is successful, then flow proceeds to step 455. If, in either case, the attempt to contact the DHCP server or EMS server was unsuccessful, the process returns to step 440. In other words, the process of contacting the DHCP and EMS servers repeats until successful. At step 455, the EMS server configures the node as a feeder terminal. At step 460, the optional step of changing the intermediate node takes place. In particular, the management server sends a prioritised list of potential intermediate nodes to the (now) feeder terminal. The feeder terminal then switches the intermediate node based on the prioritised list. In any event, at step 465, the node begins operation as a feeder terminal.

Figure 8:
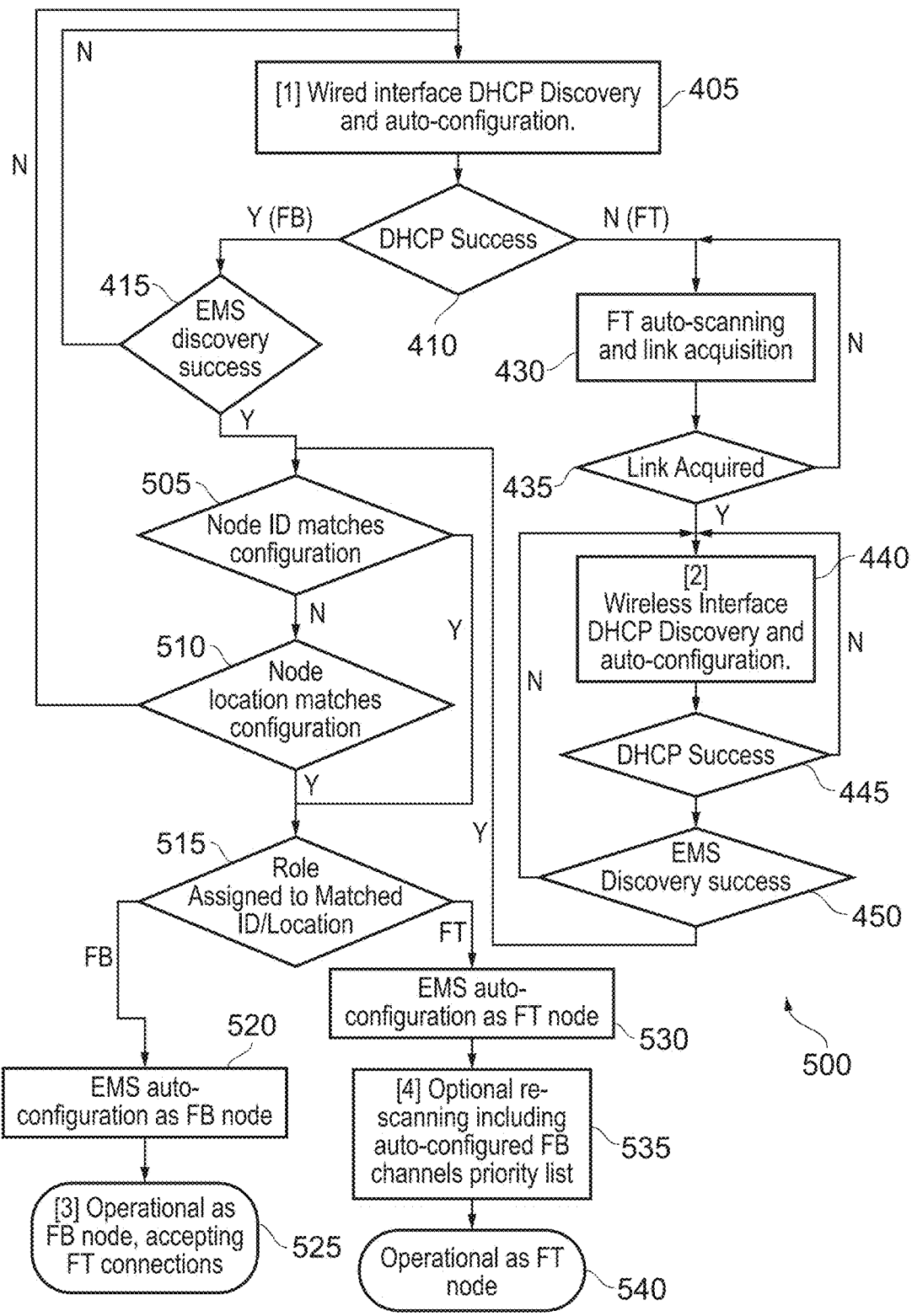
FIG. 8 illustrates a flow chart illustrating the process of a node connecting to a wireless feeder network in accordance with one embodiment.

FIG. 8 shows a flowchart 500 illustrating an embodiment in which the decision regarding the role that a node should adopt is additionally based on an id and geographical position of the node. The process begins similarly to the embodiment shown in FIG. 7 and similar numbers have been used where the process is substantially similar. However, in the case that a node is unable to form a direct connection, after initially (temporarily) connecting to the management server indirectly as a feeder terminal, the process flows from step 450 to step 505. Similarly, once EMS discovery has succeeded after forming a direct connection to the management server at step 414 as a feeder base station or intermediate node, the process flows to step 505. At step 505, the management server determines whether an ID of the connecting node has an assigned configuration. If so, then the process flows to step 515. Otherwise, the process flows to step 510 where it is determined whether or not the node's location (as provided by the node) has an assigned configuration. In this embodiment, there need not be an exact match between the node's location and the location assigned with a particular configuration. For example, these can be allowed to deviate by up to one meter. This distance can vary depending on the density of the network. In any event, if there is no configuration assigned to the node's location, then the flow returns to step 405. This represents the situation in which no configuration is available for the node. Alternatively, at step 515, it is determined whether the configuration is for a feeder terminal or a feeder base station (intermediate node). If the configuration is for a feeder base station then at step 520, the node is configured as a feeder base station. The node then operates as a feeder base station at step 525, which can include accepting connections from other feeder terminals, i.e. acting as an intermediate node between feeder terminals and the management server. If, at step 515, it is determined that the configuration is for a feeder terminal, then at step 530, the node is configured as a feeder terminal node. At step 535, the node can then re-scan for a more appropriate feeder base station (intermediate node) to provide the connection to the management server. Finally, at step 540, the node goes on to operate as a feeder terminal.

It will be appreciated that, in this embodiment, either the step of considering a configuration based on the node's id (at step 505) or the step of considering a configuration based on the node's location (at step 510) can be omitted. The node's role will thereby be determined based on only one of these two factors.

Note that although, in the present application, embodiments have been described with reference to a feeder network, such a network is strictly optional. In particular, the nodes described within this application may be applicable to any network in which a node may acquire one of a plurality of different roles and in which it is desirable to limit the skill required for an operator to install the node in order to connect the node to the network.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. A node for use in a network, the node comprising:
communication circuitry to communicate with a management server, including wireless communication circuitry to communicate with intermediate nodes wirelessly, and in response to the node communicating with the management server, the node receives configuration data from the management server;
bootstrap circuitry to initially identify an intermediate node from at least one available node in the network in response to the communication circuitry being unable to communicate with the management server directly, wherein the communication circuitry is arranged to communicate with the management server indirectly via the intermediate node when unable to communicate with the management server directly;
role assignment circuitry to assign a role to be performed by the node in the network based on whether the communication circuitry communicates with the management server directly, or indirectly via an intermediate node, wherein
the role assignment circuitry assigns the node a role of intermediate node when the communication circuitry communicates with the management server directly; and
the role assignment circuitry assigns the node a role of feeder terminal when the communication circuitry communicates with the management server indirectly via an intermediate node; and wherein
the wireless communication circuitry is rotatable;
the configuration data comprises direction data; and
the wireless communication circuitry is to rotate based on the direction data.

2. The node according to claim 1, the node further comprising:
storage circuitry to store a list of intermediate nodes and associated priorities received from the management server in response to the node communicating with the management server indirectly;
selection circuitry to select the intermediate node from the prioritised list of intermediate nodes based on the associated priorities, wherein
the communication circuitry is to perform further communication with the management server indirectly via the intermediate node selected from the prioritised list of intermediate nodes.

3. The node according to claim 1, wherein
the wireless communication circuitry is an antenna array.

4. The node according to claim 1, the communication circuitry comprising:
wired communication circuitry to communicate directly with the management server.

5. The node according to claim 1, wherein
the configuration data comprises firmware.

6. The node according to claim 1, wherein
the configuration data comprises an indicator of whether the node should act as a point-to-point node or as a point-to-multipoint node.

7. The node according to claim 1, wherein
the configuration data comprises an indication of an RF frequency; and
the wireless communication circuitry is to operate in accordance with the RF frequency.

8. The node according to claim 1, wherein
the configuration data comprises an indication of beam width; and
the wireless communication circuitry is to shape a transmission beam width based on the beam width.

9. The node according to claim 1, wherein
the role assignment circuitry selects and assigns the role to be performed by the node based on whether the communication circuitry communicates with the management server directly, or indirectly via an intermediate node.

10. The node according to claim 1, wherein
the role assignment circuitry assigns the role to be performed by the node in response to a control signal from the management server; and
the control signal is based on whether the communication circuitry communicates with the management server directly, or indirectly via an intermediate node.

11. The node according to claim 1, wherein
the bootstrap circuitry initially identifies the intermediate node from the at least one available node in the network based on at least one of: a cell id, a communication direction, a received signal strength indicator, a carrier to noise and interference ratio, a multiple input and multiple output mode, a multiple input and multiple output rank, a signal to noise ratio equivalent rate, and an average bandwidth in relation to each of the at least one available node in the network.

12. The node according to claim 1, wherein
the node comprises a location receiver to receive a signal indicative of a location of the location receiver; and
in response to the node communicating with the management server, the node transmits the location of the location receiver to the management server.

13. The node according to claim 12, wherein
the role assignment circuitry is to assign the role to be performed by the node in the network further based on the location of the location receiver.

14. The node according to claim 1, wherein
the role assignment circuitry is to assign the role to be performed by the node in the network further based on an id of the node.

15. The node according to claim 1, wherein the node is to provide wireless backhaul to items of end-user equipment.

16. The node according to claim 1, wherein
when the role assigned to the node is intermediate node, the node is to provide wireless backhaul to a further node having a role of feeder terminal; and
when the role assigned to the node is feeder terminal, the node is to provide the wireless backhaul from the intermediate node to an access base station to which items of end-user equipment connect.

17. A network comprising:
a plurality of nodes according to claim 1; and
the management server, wherein
the plurality of nodes includes the intermediate node to directly communicate with the management server; and
the plurality of nodes includes a further node to indirectly communicate with the management server via the intermediate node.

18. A method of operating a node, the method comprising the steps:
attempting to communicate with a management server directly;

in response to the node being unable to communicate with the management server directly, identifying an intermediate node from at least one available node in the network and communicating with the management server indirectly wirelessly via an intermediate node using rotatable wireless communication circuitry;

assigning a role to be performed by the node in the network based on whether the node communicates with the management server directly, or indirectly via an intermediate node, wherein said assigning a role includes assigning the node a role of intermediate node when the communication circuitry communicates with the management server directly; and said assigning a role includes assigning the node a role of feeder terminal when the communication circuitry communicates with the management server indirectly via an intermediate node;

receiving configuration data comprising direction data from the management server; and rotating the wireless communication data based on the direction data.

19. A node for use in a network, the node comprising:

communication means for communicating with a management server, including rotatable wireless communication means for communicating with an intermediate node wirelessly, and wherein in response to the node communicating with the management server, the node receives configuration data from the management server;

bootstrap means for initially identifying an intermediate node from at least one available node in the network in response to the communication means being unable to communicate with the management server directly, wherein the communication means is arranged to communicate with the management server indirectly via the intermediate node when unable to communicate with the management server directly; and role assignment means for assigning a role to be performed by the node in the network based on whether the communication means communicates with the management server directly, or indirectly via an intermediate node, wherein the role assignment means assigns the node a role of intermediate node when the communication circuitry communicates with the management server directly; and the role assignment means assigns the node a role of feeder terminal when the communication circuitry communicates with the management server indirectly via an intermediate node; and wherein the configuration data comprises direction data; and the rotatable wireless communication means is to rotate based on the direction data.

\* \* \* \* \*